United States Patent [19]

Deyer

[11] Patent Number: 4,599,606

[45] Date of Patent: Jul. 8, 1986

[54] SYSTEM FOR INPUTTING A SELECTED ONE OF A PLURALITY OF INPUTS TO A COMPUTER

[75] Inventor: Craig E. Deyer, Akron, Pa.

[73] Assignee: RCA Corporation, Princeton, N.J.

[21] Appl. No.: 402,544

[22] Filed: Jul. 28, 1982

[51] Int. Cl.⁴ .............................................. G06F 3/02
[52] U.S. Cl. ................................................ 340/365 S
[58] Field of Search ............................. 364/200, 900; 340/365 S, 365 R

[56] References Cited

U.S. PATENT DOCUMENTS 4,310,720 1/1982 Check, Jr. ......................... 178/22.08
4,321,695 3/1982 Redwine et al. ..................... 365/174

OTHER PUBLICATIONS

Basic Principles & Practice of Microprocessors by Heffer, King & Keith, 1981.

Primary Examiner—Gareth D. Shaw
Assistant Examiner—John G. Mills
Attorney, Agent, or Firm—E. M. Whitacre; D. H. Irlbeck; T. H. Magee

[57] ABSTRACT

A system for inputting any one of a plurality of inputs to a computer includes a latch circuit which provides an input to the computer in response to the input. The latch circuit also provides a start signal to the computer when the parity is correct. The start signal is delayed so that the system is independent of the amount of time that a switch is held closed by the operator.

7 Claims, 2 Drawing Figures

SYSTEM FOR INPUTTING A SELECTED ONE OF A PLURALITY OF INPUTS TO A COMPUTER

BACKGROUND OF THE INVENTION

This invention relates generally to computer controlled systems and particularly to a system for providing a selected input from a plurality of inputs to the computer of such a system.

Typically the commands to a computer controlled system are supplied from a keyboard having a plurality of keys each of which places a particular command into the computer. The operator depresses the appropriate key and the computer receives the command.

An example of such a system is a computer controlled lighthouse which is used to expose the black matrix material on the inside surface of a color kinescope faceplate panel. In applying the black matrix to such a panel, a photosensitive is applied to the inside of the faceplate and a shadow mask is inserted into the panel. Intense light from the lighthouse lamp passes through the apertures in the shadow mask to expose portions of the photosensitive material. The shadow mask is then removed from the panel and the unexposed material washed away leaving a series of lines which are used to form the black matrix. Tubes vary in size and type, and shadow masks, therefore, have different light transmission capabilities. The required light exposure of the photosensitive material, therefore, must be set into the computer controlled lighthouse for each shadow mask. Shadow masks typically are grouped into categories in accordance with their light transmission capability. These categories are called cell sizes. Before the exposure of a panel, the cell size of the shadow mask is set into the computer to assure the proper exposure. Accordingly, there is a need for a system which permits the input of the particular cell size by momentarily closing a single switch within a set of switches provided on the panel of a system control computer.

The instant invention fulfills this requirement by the provision of a system for inputting a selected one of a plurality of commands to a computer by the closing of a single switch available on the panel of a computer.

CROSS REFERENCE TO RELATED APPLICATIONS

The following patent applications, filed of even data herewith by Craig E. Deyer, describe systems which can be used in a computer controlled system employing the instant invention.

Application Ser. No. 402,546, filed July 28, 1982, entitled "Switch Arrangement for Accessing a Computer" now U.S. Pat. No. 4,539,654.

Application Ser. No. 402,545, filed July 28, 1982, entitled "System for Providing a Multi-Bit Input to a Computer Controlled System", now U.S. Pat. No. 4,513,394.

Application Ser. No. 402,428, filed July 28, 1982, entitled "System for Converting The Frequency Of A Pulse Train To A Binary Number", now U.S. Pat. No. 4,499,588.

Application Ser. No. 402,426, filed July 28, 1982, entitled "System For Inputting A Security Code To A Computer", now U.S. Pat. No. 4,538,027.

Application Ser. No. 267,750, filed May 28, 1981, now U.S. Pat. No. 4,436,394 entitled "System And Method For Controlling The Exposure Of Color Picture Tube Phosphor Screens", and application Ser. No. 267,991, now U.S. Pat. No. 4,370,036. entitled "System And Method For Intermittently Moving A Picture Tube Panel On A Lighthouse", and application Ser. No. 267,749, filed May 28, 1981, now U.S. Pat. No. 4,416,521 entitled "System And Method For Determining the Light Transmission Characteristics Of Color Picture Tube Shadow Masks", all filed on May 28, 1981 by W. R. Kelly and E. J. Alvero describe a lighthouse control system which can receive access commands from the instant invention.

SUMMARY OF THE INVENTION

A system for inputting a selected one of a plurality of inputs to a computer includes a plurality of switches equal in number to the inputs. A latch circuit has a plurality of output terminals and an equal number of input terminals, each of which is responsive to one of the switches whereby one input terminal changes logic state when one of the switches is actuated. The latch circuit also receives a strobe signal to cause one output terminal to change state. An actuate signal is provided to logic means which provides a start signal to the computer and the strobe signal to the output logic whereby the change of logic state of an output terminal is input to the computer.

DETAILED DESCRIPTION OF THE PREFERRED EMBODIMENT

Figure 1:
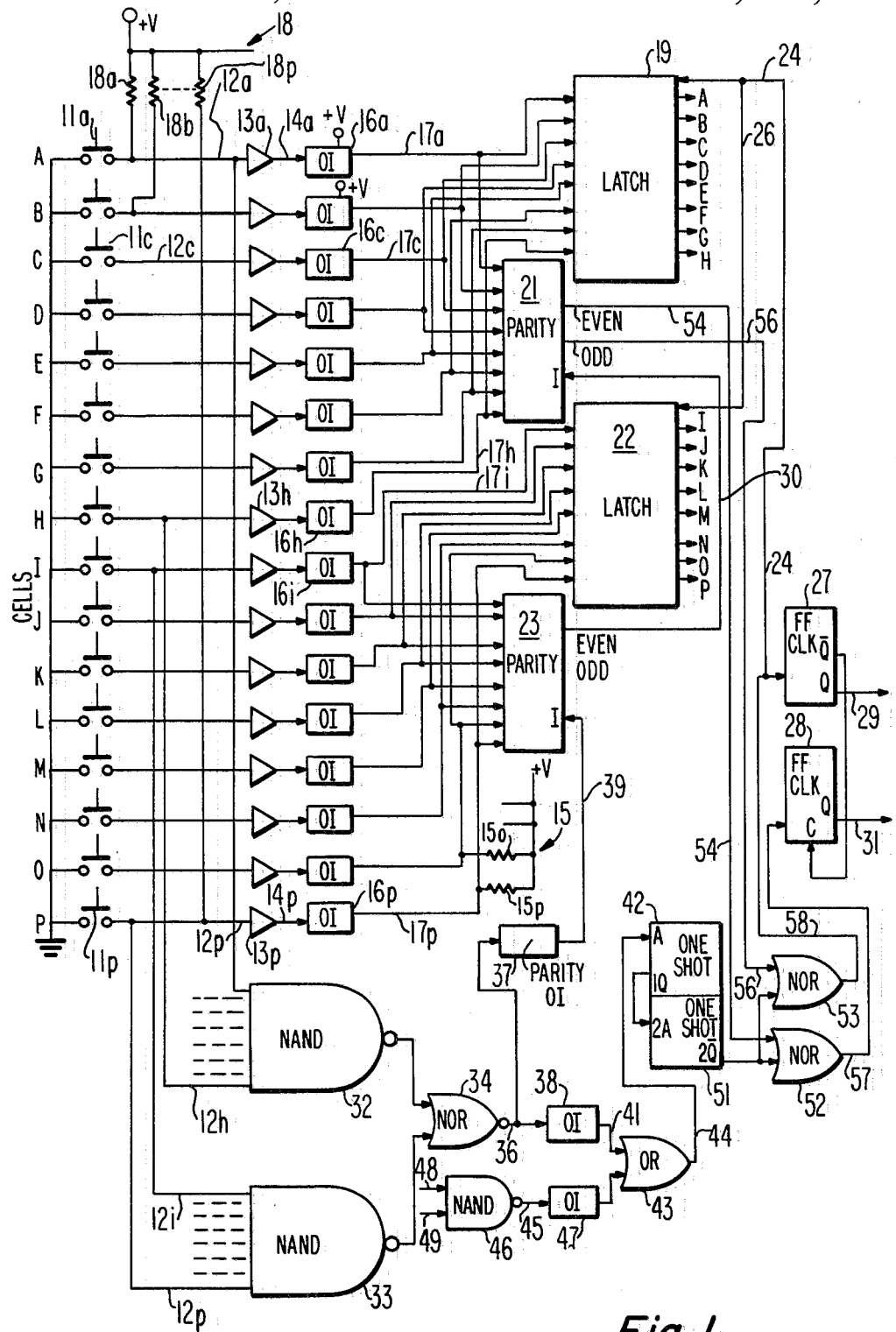
FIG. 1 is a block diagram of a preferred embodiment of the instant invention.

In FIG. 1, the system 10 includes a plurality of switches 11a–11p having one side connected to ground. The switches 11a–11p are the normally-open momentarily-closed type and, therefore, remain closed only as long as the operator depresses the control button. The other side of the switches 11a–11p are connected by lines 12a–12p, respectively, to a plurality of driver networks 13a–13p. The output terminals of the driver networks 13a–13p are connected by lines 14a–14p to a plurality of opto-isolators 16a–16p each of which has an output line 17a–17p.

Each of the switches 11a–11p carries a cell designation such as Cell A, Cell B, etc. These cell designations identify the light transmission capabilities of various shadow mask types and thus are input to the control system of the lighthouse by the instant system. The Cell A designation can be used to inform the control system that a shadow mask having a light transmission capability between 15% and 16% is to be processed. The Cell B designation can be used to identify shadow masks having a light transmission capability between 16% and 17% the Cell C 17% to 18% etc. Accordingly, the light transmission capability of the shadow mask to be processed can be input to the computer by closing one of the switches 11a–11p.

Each of the lines 12a–12p is positive biased through a resistor arrangement 18 only two resistors 18a and 18b of which are shown for convenience. The lines 12a–12p and 14a–14p, therefore are normally high. The output lines 17a–17p of the opto-isolators 16a–16p also are biased normally high by a resistor arrangment 15, only two resistors 15o and 15p of which are shown for convenience. The output lines 17a–17h of the opto-isolators 16a–16h are coupled to a cell size output circuit in the form of a latch circuit 19 and to a parity check circuit 21. Similarly, the output lines 17i–17p of the opto-isolators 16i–16p are coupled to the input terminals of a latch circuit 22 and to a parity check circuit 23. The latch circuits and the parity check circuits are commercially available circuits. For example, the latch circuits 19 and 22 can be Texas Instruments 74LS377 circuits and the parity circuits 21 and 23 can be Texas Instruments 74LS290 circuits. The latch circuit 19, therefore, can receive an input from any of the eight lines 17a–17h and provides an output on one of the output terminals identified A-H. The latch circuit 19 also receives a strobe input from a line 24. Similarly, the latch circuit 22 receives inputs from the eight input lines 17i–17p and provides an output on one of the eight output terminals I-P. The latch circuit 22 also receives a strobe input from a line 26 which is electrically coupled to the strobe input line 24 to the latch circuit 19. The line 24 is coupled to the clock input of a D-type flip-flop 27. The $\overline{Q}$ output of the flip-flop 27 is connected to the clear input of another D-type flip-flop 28. The Q output of the flip-flop 27 provides a start signal on an output terminal 29 and the Q output of the flip-flop 28 provides a parity check signal on an output terminal 31 in a manner described hereinafter.

The normally high input lines 12a–12h are coupled to the input terminals of a NAND Gate 32. Similarly, the normally high input lines 12i–12p are coupled to the input terminals of a NAND Gate 33. The output terminals of the NAND Gates 32 and 33 are coupled to the input terminals of a NOR Gate 34. The output terminal 36 of the NOR Gate 34 is coupled to the input terminals of a parity opto-isolator 37 and a start opto-isolator 38. The output line 39 of the parity opto-isolator 37 is coupled to the input terminal of the parity circuit 23. The output line 41 of the start opto-isolator 38 is connected to the A input of a one-shot multivibrator 42 through an OR Gate 43 and a line 44.

The ouput terminal 45 of a NAND Gate 46, is connected to the input terminal of an opto-isolator 47 the output of which is coupled to the input terminal of the OR Gate 43. The NAND Gate 46 receives a stud sense signal and a panel present signal on input terminals 48 and 49, respectively. The stud sense and the panel present signals are used to verify the proper orientation and presence of a panel on the lighthouse prior to other commands being input to the control system. The provision of these signals is a function of the lighthouse control system and the details are not required herein.

Initially, no panel is present and both the input terminals 48 and 49 of the NAND Gate 46 are low, the output terminal 45 is high and the output line 44 of the OR Gate 43 is also high. At the same time, all the switches 11a–11p are open and the output terminal 36 of the NOR Gate 34 is high. When the stud sense and panel present signals are input to the NAND Gate 46 the output terminal 45 goes low. However, the output of the OR Gate 43 remains high until one of the switches 11a–11p is closed. When one of the switches 11a–11p is closed, the output terminal 36 of the NOR Gate 34 goes low. Both the input terminals of the OR Gate 43 are low and the line 44 goes low to provide an actuate signal and trigger the one-shot 42.

The Q output terminal of the one shot 42 is coupled to the A input terminal of another one-shot multivibrator 51. The $\overline{Q}$ output terminal of the one-shot 51 is coupled to one input terminal of each of the NOR Gates 52 and 53. The other input terminal of the NOR Gate 52 receives an even parity input signal from the parity circuit 21 by way of the line 54. The line 54 is low when parity is odd and high when parity is even. The other input terminal of the NOR Gate 53 receives an odd parity signal from the parity circuit 21 by way of the line 56. The line 56 is low when parity is even and high when parity is odd. The output terminal of the NOR Gate 52 is coupled by a line 57 to the clock input of the flip-flop 28. The output terminal of the NOR Gate 53 is coupled by a line 58 to the clock input the flip-flop 27 and to the strobe input lines 24 and 26 to the latch circuits 19 and 22 respectively.

In operation, prior to the closing of any of the switches 11a–11p all the output lines 12a–12p are high because of the biasing resistors 18a–18p. Accordingly, the output lines 14a–14p of the driver circuits 13a–13p also are high and the output lines 17a–17p of the isolators 16a–17p are high because of the biasing network 15. The latch circuits 19 and 22 and the parity circuits 21 and 23, therefore, receive all high inputs. Also, prior to the closing of any of the switches 11a–11p all of the input lines to the NAND Gates 32 and 33 are high and both input terminals of the NOR Gate 34 are low. The output terminal 36 of the NOR Gate 34 is high and the parity isolator 37 and start isolator 38 have a high output. During this time, $2\overline{Q}$ output terminal of the one-shot multivibrator 51 is high and the output lines 57 and 58 of the NOR Gates 52 and 53, respectively, are low and the clock input terminals of the flip-flops 27 and 28 also are low.

When a panel is placed upon the lighthouse, the NAND GATE 46 receives a high input on the input terminal 49. A stud sense signal on the input terminal 48 makes the output of the NAND Gate 46 go low to activate the opto-isolator 47 and the OR Gate 43 receives a low input. When one of the switches 11a–11p is closed, the output terminal 36 of the NOR Gate 34 goes from high to low. The OR Gate 43 then receives low inputs on both terminals and the lines 44 goes low to trigger the one-shot 42. When the one-shot 42 triggers the Q output terminal goes high to trigger the one-shot 51 and cause the $2\overline{Q}$ output to go low and enable the NOR Gates 52 and 53. The status of the output lines 57 and 58 of the NOR Gates 52 and 53 respectively is dependent upon the status of the even parity output line 54 and the odd parity output line 56 of the parity circuit 21. The strobe lines 24 and 26 of the latch circuits 19 and 22 respectively also are coupled to the output of the NOR Gate 53 and the latch circuits 19 and 22, therefore, are not strobed until the NOR Gate 53 output goes high.

When one of the switches 11a–11p is closed, one of the corresponding lines A-H of the latch 19 or I-P of the latch 22 can change state. The lines A to P are normally high and inverters are used to normally present a low input to the computer. The inverters are ormitted to simplify the drawing. For example, if the switch 11c is closed, the line 12c goes to ground, the input terminal of the opto-isolator 16c goes low and the output line 17c goes low. In this condition, a low will be available on the output terminal C of the latch circuit 19 when the strobe line 24 goes high in response to NOR Gate 53 changing state. The change of state of the NOR Gate 53 is dependent upon the results of the parity check by the parity circuits 21 and 23.

The low on any of the lines 17a to 17p also provides a low input to one of the parity check circuits 21 or 23. When the parity is even, which is the condition desired, the normally high line 56 goes low. When the parity is odd the line 54 goes low. When the parity is odd the one-shot 42 is triggered and the Q output goes high for a time period determined by the time constant of the one-shot. The odd parity line 56 of parity circuit 21 is high, and the NOR Gate 53 is inhibited. Accordingly, the flip-flop 27 is not clocked and a start signal is not available on output 29. At the same time, the even parity line 54 is low and NOR Gate 52 is enabled. When the one-shot 42 times out, the transition return to low triggers the one-shot 51 and the $2\overline{Q}$ output terminal goes low for a time period determined by the time constant of the one-shot. The output terminal 57 of the NOR Gate 52 goes high and clocks the flip-flop 28 to provide a parity error signal on line 31. The NOR Gate 53 output line 58 did not go high and, therefore, the latch circuits 19 and 22 were not strobed to present an input to the computer.

When the parity is even, line 56 is low and enables the NOR Gate 53 while line 54 is high and inhibits NOR Gate 52. When the one-shot 42 times out, the output line 58 of NOR Gate 53 goes high and clocks flip-flop 27. The Q output terminal of flip-flop 27 goes high to provide a valid start signal to the computer. The high on line 58 also causes the strobe lines 24 and 26 to the latch circuits 19 and 21 to go high and strobe any valid input to the appropriate output line A-P. The clocking of the flip-flop 27 also causes the $\overline{Q}$ output terminal to go low. This terminal is coupled to the clear input terminal of flip-flop 28 to reset the flip-flop and cancel any previous parity error signal. The start signal on output terminal 29 of flip-flop 27 causes the computer to read the data from the output lines A-P of the latch circuit 19 and 22. After these lines are read, a negative pulse is provided by the computer control system to the clear input of flip-flop 27. The flip-flops 27 and 28 are then in the reset condition and are ready for a new data input.

Figures 2A, 2B, 2C:
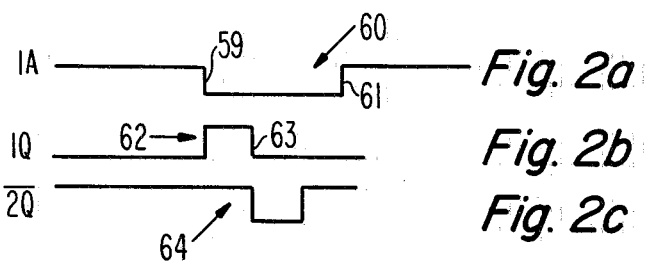
FIGS. 2a, 2b and 2c show how the start pulse is delayed after a switch is closed.

The manner in which the one-shot multivibrators 42 and 51 cooperate to delay the generation of a start signal on the output line 29 of the flip-flop 27 until the parity check is complete is shown in FIGS. 2a, 2b and 2c. In FIG. 2a, the A input terminal of the one-shot 42 is normally high and the one-shot is triggered by the leading edge 59 of the signal 60 which occurs when the line 41 goes low. The trailing edge 61 of the pulse 60 returns the A input terminal of the one-shot 42 to a high condition. It should be noted that the trailing edge 61 can vary in time depending on the amount of time that the operator holds one of the switches 11a–11p closed. The leading edge 59 of the pulse 60 causes the Q output terminal of the flip-flop 42 to go from low to high as shown by the pulse 62 in FIG. 2b. The trailing edge 63 of the pulse 62 triggers the 2A input of the one-shot 51 after a delay determined by the time constant of the one-shot. The normally high $2\overline{Q}$ output of the one-shot 52 is triggered low by the trailing edge 63 of the one-shot 42 Q output causing the pulse 64 of FIG. 2c to be available on the $2\overline{Q}$ output terminal of the one-shot 51. When the $2\overline{Q}$ output is low for the duration of the pulse 64 one input terminal of each of the NOR Gates 52 and 53 also is low and both of the gates are enabled and respond to the parity lines 54 and 56 in the manner described above.

I claim:

1. A logic system and keyboard for inputting a selected one of a plurality of inputs to a computer comprising:
   a plurality of switch means equal in number to said plurality of inputs;
   latch circuit means having an equal number of input terminals and output terminals, said latch circuit means having a strobe input terminal for receiving a strobe signal, each of said input terminals being responsive to one of said switch means whereby one of said output terminals changes logic state in response to said strobe signal when one of said switch means is actuated to produce a change of state signal;
   sequential logic means responsive to said change of state signal of one of said switch means for providing an actuate signal; and
   logic responsive to said actuate signal for providing both said strobe signal to said latch circuit means and a start signal to said computer whereby said change of state of one of said output terminals is input to said computer.

2. The system of claim 1 wherein said logic means includes means for delaying said actuate signal for a preselected time.

3. The system of claim 2 further including means for providing a stud sense signal and means for providing a panel present and wherein said means for providing said actuate signal includes logic means responsive to said stud sense signal and said panel present signal whereby said actuate signal is provided when said stud sense signal and said panel present signal are simultaneously available.

4. The system of claim 3 wherein said latch circuit means includes at least one latch circuit.

5. The system of claim 4 further including means for providing a parity signal to said computer.

6. The system of claim 4 or 5 wherein said means for delaying said actuate signal includes at least one one-shot multivibrator.

7. The system of claim 6 wherein said logic means includes gate means responsive to said at least one one-shot multivibrator and to said change of state signal, and said logic means includes flip-flop means responsive to said gate means for providing said start signal.

* * * * *

UNITED STATES PATENT AND TRADEMARK OFFICE
CERTIFICATE OF CORRECTION

PATENT NO. : 4,599,606

DATED : July 8, 1986

INVENTOR(S) : Craig Eugene Deyer

It is certified that error appears in the above-identified patent and that said Letters Patent is hereby corrected as shown below:

Column 1, line 19, after "photosensitive" insert --
material --

Signed and Sealed this

Seventh Day of October, 1986

[SEAL]

Attest:

DONALD J. QUIGG

Attesting Officer  Commissioner of Patents and Trademarks